(12) United States Patent
Tadakuma et al.

(10) Patent No.: US 10,043,762 B2
(45) Date of Patent: Aug. 7, 2018

(54) SEMICONDUCTOR DEVICE (71) Applicant: Mitsubishi Electric Corporation, Tokyo (JP)

(72) Inventors: Toshiya Tadakuma, Tokyo (JP); Toma Takao, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 5 days.

(21) Appl. No.: 15/259,441

(22) Filed: Sep. 8, 2016

(65) Prior Publication Data

US 2017/0207178 A1    Jul. 20, 2017

(30) Foreign Application Priority Data

Jan. 19, 2016 (JP) .................. 2016-007556

(51) Int. Cl.
| | |
|---|---|
| *H01L 23/552* | (2006.01) |
| *H01L 23/31* | (2006.01) |
| *H01L 23/495* | (2006.01) |
| *H01L 23/00* | (2006.01) |
| *H01L 25/07* | (2006.01) |

(52) U.S. Cl.
CPC ........ *H01L 23/552* (2013.01); *H01L 23/3114* (2013.01); *H01L 23/4952* (2013.01); *H01L 23/49513* (2013.01); *H01L 23/49562* (2013.01); *H01L 23/49568* (2013.01); *H01L 23/49575* (2013.01); *H01L 24/48* (2013.01); *H01L 25/072* (2013.01); *H01L 2224/48139* (2013.01); *H01L 2924/00014* (2013.01); *H01L 2924/181* (2013.01)

(58) Field of Classification Search
CPC .............. H01L 23/495; H01L 23/552; H01L 23/49568; H01L 23/60; H01L 2225/06537; H01L 2924/3025; H05K 9/003; H05K 9/0081–9/0092
See application file for complete search history.

(56) References Cited

U.S. PATENT DOCUMENTS

| | | | |
|---|---|---|---|
| 6,707,168 B1 * | 3/2004 | Hoffman | H01L 23/3128 174/359 |
| 8,338,928 B2 * | 12/2012 | Chen | H01L 23/495 257/685 |
| 8,659,125 B2 * | 2/2014 | Chen | B82Y 30/00 257/659 |

(Continued)

FOREIGN PATENT DOCUMENTS

| | | |
|---|---|---|
| JP | 05-095055 A | 4/1993 |
| JP | 08-191115 A | 7/1996 |
| JP | 2013-058513 A | 3/2013 |

*Primary Examiner* — Jose R Diaz (74) *Attorney, Agent, or Firm* — Studebaker & Brackett PC (57) ABSTRACT

A semiconductor device includes a plurality of semiconductor elements including a power semiconductor element, a lead frame including one main surface on which the plurality of semiconductor elements are mounted, a resin that seals the plurality of semiconductor elements and a part of the lead frame where the plurality of semiconductor elements are mounted, and at least one shield member disposed above the plurality of semiconductor elements on a side of the one main surface of the lead frame. The shield member is held by the resin, and the shield member has a higher magnetic permeability or a higher electrical conductivity than the resin.

9 Claims, 5 Drawing Sheets (56) References Cited

U.S. PATENT DOCUMENTS

2005/0184405 A1* 8/2005 Bai .................. H01L 23/295
    257/787
2014/0284775 A1* 9/2014 Nomura ............ H01L 23/552
    257/659

* cited by examiner

SEMICONDUCTOR DEVICE

BACKGROUND OF THE INVENTION

Field of the Invention

The present invention elates to a semiconductor device, and more particularly, to a semiconductor device including a power semiconductor element mounted thereon.

Description of the Background Art

A semiconductor device having a resin-sealed power semiconductor element (also called as a transfer-mold power module) is known. The power semiconductor element is mounted on a lead frame, and the lead frame includes a heat sink on the opposite side to the power semiconductor element. In recent years, in order to improve heat dissipation, an insulating sheet with a metal thin film may be disposed on a surface that is in contact with fins of a heat sink.

Due to surge current or surge voltage associated with controlling high voltage and large current at high speed, noise, such as radiation noise and noise terminal voltage, is generated from a power semiconductor element and its terminals. Accordingly, technological development has been promoted to reduce such noise below the standards of the International Special. Committee on Radio Interference (CISPR) for controlling noise. Resistors, inductors, capacitors, semiconductor elements, and wiring lines between them included in an electric circuit have been devised to reduce noise. However, further reduction of noise is desired.

For example, according to Japanese Patent Application Laid-Open No. 08-191115 (1996), a metal shield plate is disposed on the back surface of a lead frame (a surface opposite to the surface on which a semiconductor element is mounted) to reduce radiation noise by electrostatic shielding.

As described above, according to Japanese Patent Application Laid-Open No. 08-191115 (1996), the metal shield plate is disposed on the back surface of the lead frame, and thus reduction of radiation noise cannot be achieved on a side of the lead frame on which the semiconductor element is mounted.

SUMMARY OF THE INVENTION

An object of the present invention is to provide a semiconductor device capable of suppressing noise, such as radiation noise and noise terminal voltage.

The semiconductor device according to the present invention includes a plurality of semiconductor elements including a power semiconductor element, a lead frame including one main surface on which the plurality of semiconductor elements are mounted, a resin that seals the plurality of semiconductor elements and a part of the lead frame where the plurality of semiconductor elements are mounted, and at least one shield member disposed above the plurality of semiconductor elements on a side of the one main surface of the lead frame. The shield member is held by the resin, and the shield member has a higher magnetic permeability or a higher electrical conductivity than the resin.

In the semiconductor device according to the present invention, the shield member having a higher magnetic permeability or a higher electrical conductivity than the resin is disposed above the plurality of semiconductor elements including the power semiconductor element. With this configuration, radiation noise generated by a switching operation of the power semiconductor element is efficiently shielded, and thus noise, such as radiation noise and noise terminal voltage, is suppressed from radiating to the outside of the semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

<Prior Art Technique>

Figure 9:
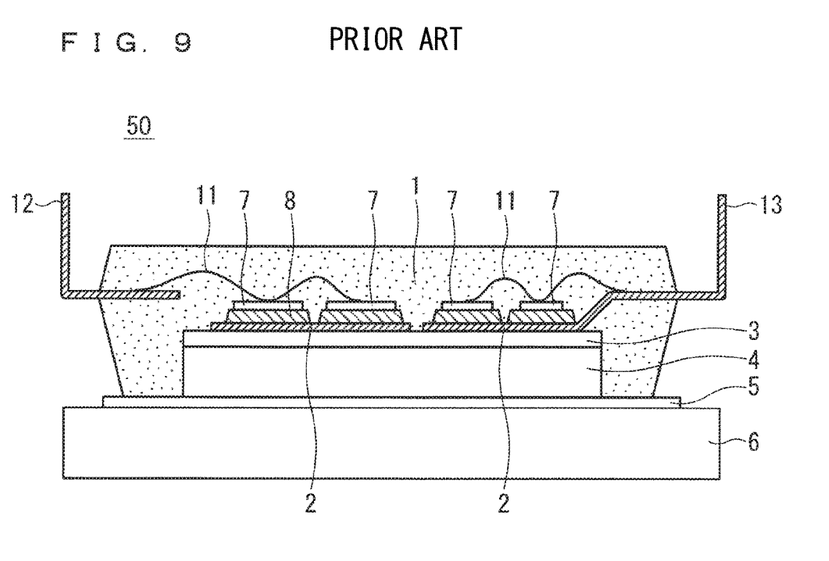
FIG. 9 is a sectional view of a semiconductor device according to a prior art technique.

Before describing preferred embodiments of the present invention, a prior art technique for the present invention is described below. FIG. 9 is a sectional view of a semiconductor device 50 according to the prior art technique. The semiconductor device 50 according to the prior art technique includes a plurality of semiconductor elements including power semiconductor elements 7, a lead frame 2, and a resin 1. The power semiconductor elements 7 are, for example, Insulated Gate Bipolar Transistors (IGBT), Metal-Oxide-Semiconductor Field-Effect Transistors (MOSFET), Free Wheeling Diodes, and the like as switching elements. In addition to the power semiconductor elements 7, the semiconductor device 50 may further include a drive circuit or the like (not shown) to drive the power semiconductor elements 7.

The power semiconductor elements 7 are mounted on one main surface of the lead frame 2. The lead frame 2 is electrically connected with the power semiconductor elements 7 with metal materials 8, such as solder, interposed therebetween. The resin 1 may be an epoxy resin, a polyimide resin, or the like.

Upper electrodes of the power semiconductor elements 7 and terminals 12, 13 are electrically connected with each other by wiring lines 11 appropriately. A heat sink 4 is disposed on the other main surface of the lead frame 2 (i.e., a surface opposite to the surface on which the power semiconductor elements 7 are mounted) with an insulating layer 3 interposed therebetween.

The plurality of semiconductor elements including the power semiconductor elements 7, and a part of the lead frame 2 including the plurality of semiconductor elements are sealed with the resin 1. In other words, except the bottom surface of the heat sink 4, the resin 1 seals the power semiconductor elements 7, the lead frame 2, the wiring lines 11, and the heat sink 4. The terminals 12, 13 are exposed from the resin 1.

When the semiconductor device 50 operates, the bottom surface of the heat sink 4 exposed from the resin 1 is put into contact with heat radiation fins 6 through grease 5 so as to radiate heat generated in the power semiconductor elements 7 to the outside.

As described above, each of the power semiconductor elements 7 controls a high voltage and a large current at high speed. Thus, noise, such as radiation noise and noise terminal voltage, is generated from the power semiconductor elements 7 and their terminals and badly affects an electric circuit or the like provided outside of the semiconductor device 50. Embodiments to solve such problem will be described below.

First Preferred Embodiment

Figure 1:
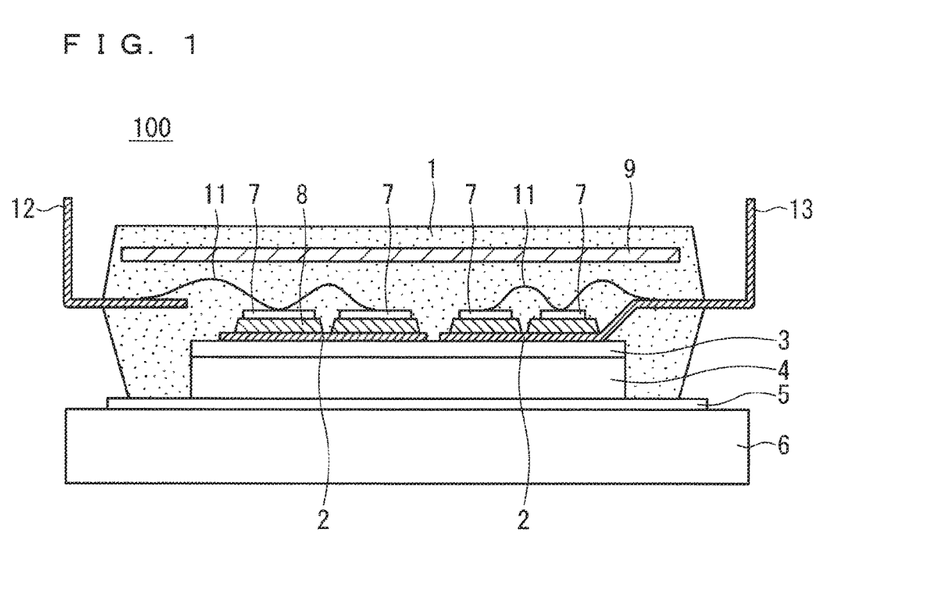
FIG. 1 is a sectional view of a semiconductor device according to a first preferred embodiment.
Figure 2:
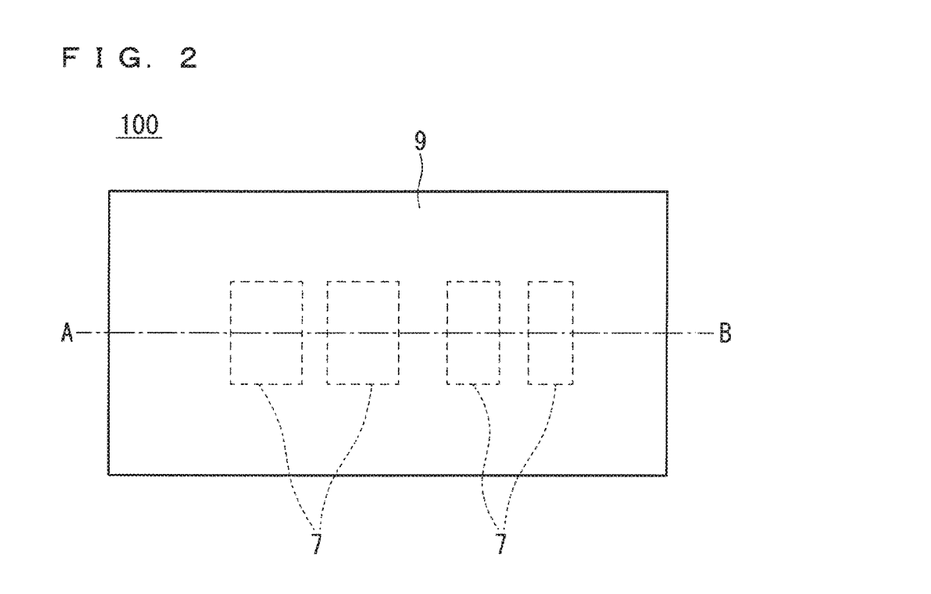
FIG. 2 is a plan view of the semiconductor device according to the first preferred embodiment.

FIG. 1 is a sectional view of a semiconductor device 100 according to a first preferred embodiment. FIG. 2 is a plan view of the semiconductor device 100. FIG. 2 shows only power semiconductor elements 7 and a shield member 9 for easy understanding. Note that FIG. 1 is a sectional view taken along line A-B of FIG. 2.

The semiconductor device 100 according to the first preferred embodiment is obtained by further providing the shield member 9 to the semiconductor device 50 according to the prior art technique. Since other configurations are the same as those of the prior art technique (FIG. 9), the descriptions thereof are omitted.

In the first preferred embodiment, the semiconductor device 100 is, for example, an Intelligent Power Module (IPM), a Dual Inline Package Intelligent Power Module (DIPIPM), or the like.

Referring to FIGS. 1 and 2, the shield member 9 is disposed above a plurality of semiconductor elements on a side of one main surface of a lead frame 2 (i.e., on a side of the surface of the lead frame 2 on which the power semiconductor elements 7 are mounted). Referring to FIG. 2, the shield member 9 is disposed in such a manner that the outline thereof resides outside of the power semiconductor elements 7 in a plan view.

Referring to FIG. 1, the shield member 9 is sealed by a resin 1 to be held by the resin 1. Note that a part of the shield member 9 may be exposed from the resin 1 as long as the shield member 9 is held by the resin 1.

The shield member 9 has a higher magnetic permeability or a higher electrical conductivity than the resin 1. For example, the shield member 9 is a metal thin film (a copper thin film, for example) having the thickness of about 0.1 mm to 1 mm. The shield member 9 may be a magnetic material, such as iron, cobalt, nickel, and amorphous alloy. The shield member 9 may also be ceramics having magnetic properties, such as ferrite.

<Effect>

The semiconductor device 100 according to the first preferred embodiment includes a plurality of semiconductor elements including the power semiconductor elements 7, the lead frame 2 including one main surface on which the plurality of semiconductor elements are mounted, the resin 1 that seals the plurality of semiconductor elements and a part of the lead frame 2 where the plurality of semiconductor elements are mounted, and the at least one shield member 9 disposed above the plurality of semiconductor elements on a side of the one main surface of the lead frame 2. The shield member 9 is held by the resin 1, and the shield member 9 has a higher magnetic permeability or a higher electrical conductivity than the resin 1.

In the semiconductor device 100 according to the first preferred embodiment, the shield member 9 having a higher magnetic permeability or a higher electrical conductivity than the resin 1 is disposed above the plurality of semiconductor elements including the power semiconductor elements 7. With this configuration, radiation noise (electromagnetic wave) generated by a switching operation of the power semiconductor elements 7 can be efficiently shielded, and thus noise, such as radiation noise and noise terminal voltage, generated from the power semiconductor elements 7 and their terminals can be suppressed from radiating to the outside of the semiconductor device 100.

In the semiconductor device 100 according to the first preferred embodiment, the shield member 9 includes any of metal, a magnetic material, or ceramics.

Since the shield member 9 includes any of metal, a magnetic material, or ceramics, the shield member 9 can exhibit a higher magnetic permeability or a higher electrical conductivity than the resin 1.

Second Preferred Embodiment

Figure 3:
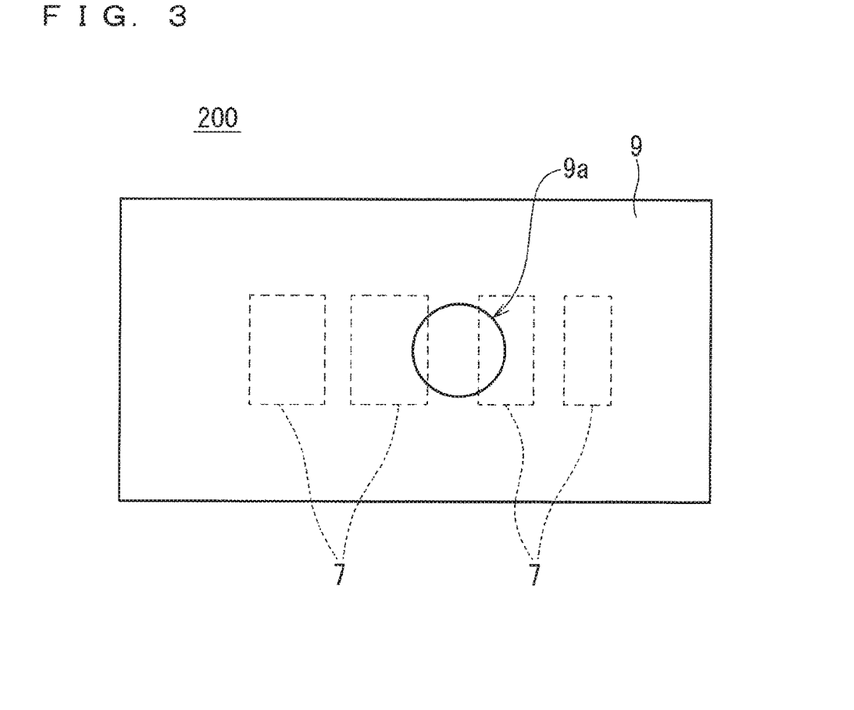
FIG. 3 is a plan view of a semiconductor device according to a second preferred embodiment.

FIG. 3 is a plan view of a semiconductor device 200 according to a second preferred embodiment. FIG. 3 shows only power semiconductor elements 7 and a shield member 9 for easy understanding.

According to the second preferred embodiment, the shield member 9 includes a through hole 9a. Since other configurations are the same as those of the first preferred embodiment (FIGS. 1 and 2), the descriptions thereof are omitted. Note that the size and the position of the through hole 9a are schematically shown in FIG. 3, and are not limited thereto.

<Effect>

In the semiconductor device 200 according to the second preferred embodiment, the shield member 9 includes the at least one through hole 9a.

This configuration produces an anchoring effect by providing the through hole 9a in the shield member 9, thereby improving adhesion property between a resin 1 and the shield member 9. As a result, durability of the semiconductor device 200 can be improved in addition to the effect of suppressing noise as described in the first preferred embodiment.

Third Preferred Embodiment

Figure 4:
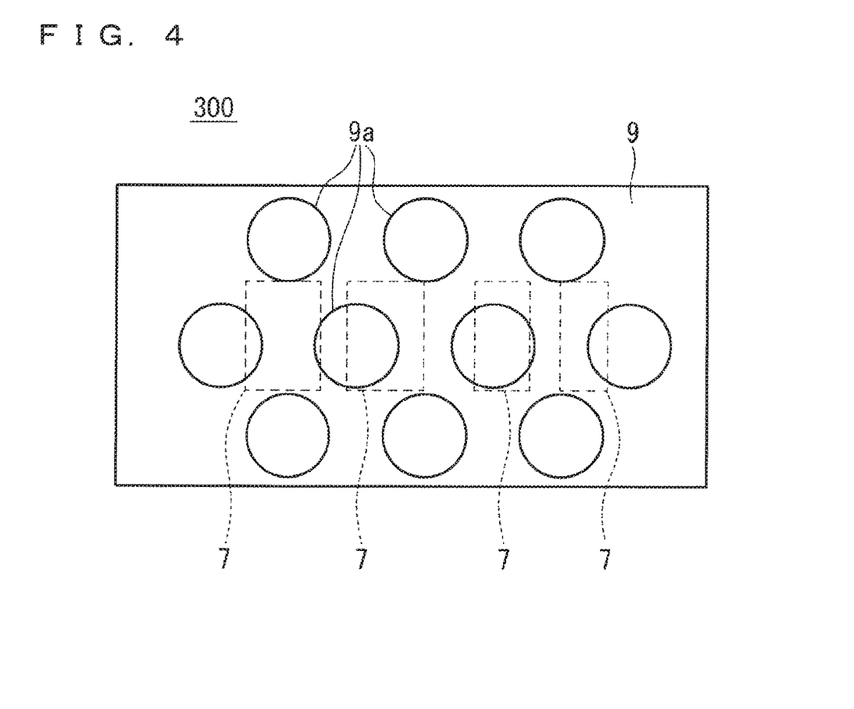
FIG. 4 is a plan view of a semiconductor device according to a third preferred embodiment.

FIG. 4 is a plan view of a semiconductor device 300 according to a third preferred embodiment. FIG. 4 shows only power semiconductor elements 7 and a shield member 9 for easy understanding.

According to the third preferred embodiment, the shield member 9 includes a plurality of through holes 9a. Since other configurations are the same as those of the first preferred embodiment (FIGS. 1 and 2), the descriptions thereof are omitted. Note that the sizes and the positions of the through holes 9a are schematically shown in FIG. 4, and are not limited thereto. FIG. 4 shows ten through holes 9a, but the number of the through holes 9a is not limited thereto.

<Effect>

In the semiconductor device 300 according to the third preferred embodiment, the at least one through hole 9a provided in the shield member 9 includes a plurality of through holes.

Since the shield member 9 includes the plurality of through holes 9a, the weight of the semiconductor device 300 can be reduced. This configuration produces an anchoring effect by providing the plurality of through holes 9a in the shield member 9, thereby further improving adhesion property between a resin 1 and the shield member 9. As a result, the weight of the semiconductor device 300 can be reduced, and durability of the semiconductor device 300 can be improved in addition to the effect of suppressing noise as described in the first preferred embodiment.

Fourth Preferred Embodiment

Figure 5:
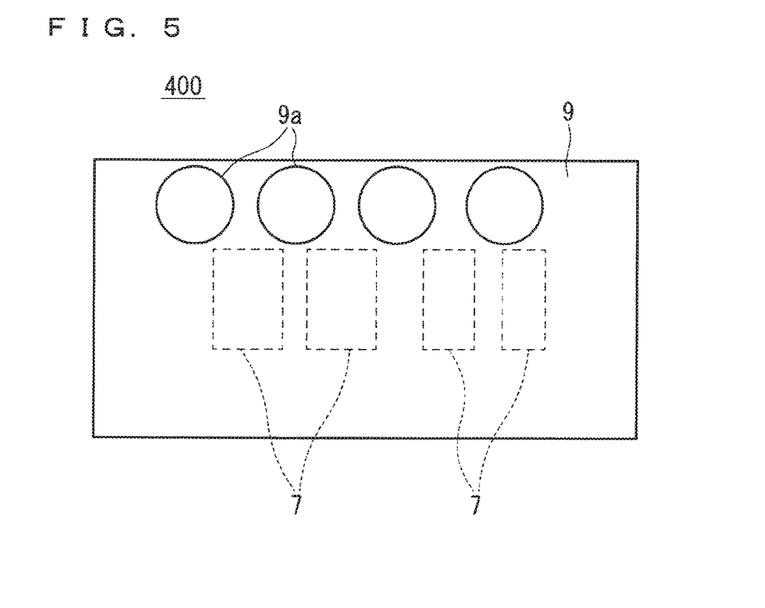
FIG. 5 is a plan view of a semiconductor device according to a fourth preferred embodiment.

FIG. 5 is a plan view of a semiconductor device 400 according to a fourth preferred embodiment. FIG. 5 shows only power semiconductor elements 7 and a shield member 9 for easy understanding.

According to the fourth preferred embodiment, the shield member 9 includes a plurality of through holes 9a. Referring to FIG. 5, the through holes 9a are disposed at positions that do not overlap the power semiconductor elements 7.

Since other configurations are the same as those of the first preferred embodiment (FIGS. 1 and 2), the descriptions thereof are omitted. Note that the sizes and the positions of the through holes 9a are schematically shown in FIG. 5, and are not limited thereto as long as the through holes 9a do not overlap the power semiconductor elements 7 in a plan view. FIG. 5 shows four through holes 9a, but the number of the through holes 9a is not limited thereto.

<Effect>

In the semiconductor device 400 according to the fourth preferred embodiment, the at least one through hole 9a provided in the shield member 9 is disposed at a position that does not overlap the power semiconductor elements 7 in a plan view.

Since the through holes 9a are provided in the shield member 9 avoiding the positions that overlap the power semiconductor elements 7 in a plan view, the weight of the semiconductor device 400 can be reduced while the shield member 9 covers an area with high intensity of radiation noise from the power semiconductor elements 7.

Fifth Preferred Embodiment

Figure 6:
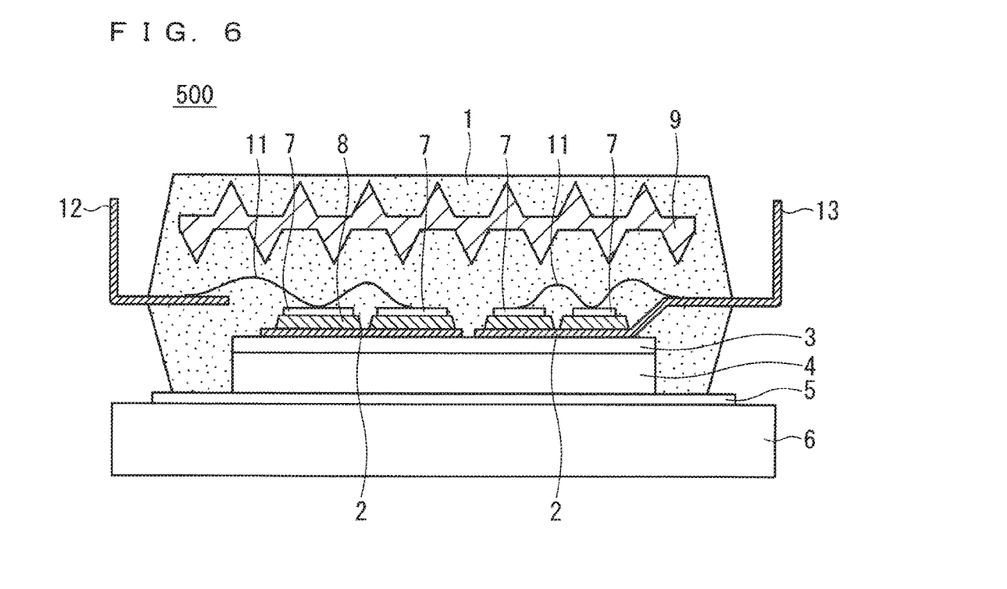
FIG. 6 is a sectional view of a semiconductor device according to a fifth preferred embodiment.

FIG. 6 is a sectional view of a semiconductor device 500 according to a fifth preferred embodiment. In the fifth preferred embodiment, a surface of a shield member 9 includes unevenness. The unevenness is projections formed on a flat surface of the shield member 9.

Since configurations are the same as those of the first preferred embodiment (FIGS. 1 and 2) except the unevenness on the surface of the shield member 9, the descriptions thereof are omitted. The projections have a triangular cross sections in FIG. 6, hut the shapes of the projections are not limited thereto.

<Effect>

In the semiconductor device 500 according to the fifth preferred embodiment, a surface of the shield member 9 includes unevenness.

Since the shield member 9 includes unevenness on its surface, directivity of radiation noise from power semiconductor elements 7, wiring lines 11, and the like can be dispersed. With this configuration, noise, such as radiation noise and noise terminal voltage, generated from the power semiconductor elements 7 and their terminals can be further suppressed from radiating to the outside of the semiconductor device 500.

Sixth Preferred Embodiment

Figure 7:
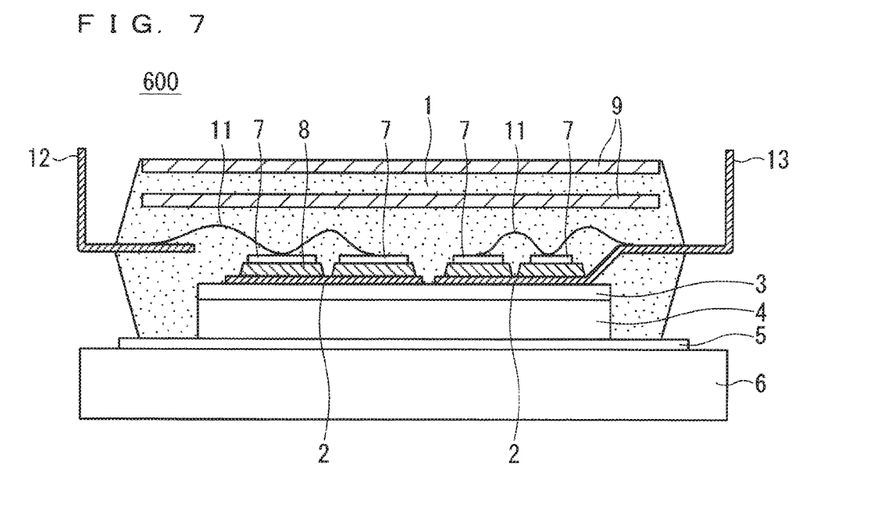
FIG. 7 is a sectional view of a semiconductor device according to a sixth preferred embodiment.

FIG. 7 is a sectional view of a semiconductor device 600 according to a sixth preferred embodiment. In the sixth preferred embodiment, a plurality of shield members 9 are provided. In this sixth preferred embodiment, two shield members 9 are disposed to overlap with each other in a plan view. Both of the two shield members 9 are held by a resin 1.

Since other configurations are the same as those of the first preferred embodiment (FIGS. 1 and 2), the descriptions thereof are omitted. Note that the two shield members 9 are provided in the sixth preferred embodiment, but the number of the shield members 9 is not limited thereto as long as a plurality of shield members 9 are disposed to overlap with each other in a plan view.

<Effect>

In the semiconductor device 600 according to the sixth preferred embodiment, the at least one shield member 9 includes a plurality of shield members, and the plurality of shield members 9 are disposed to overlap with each other in a plan view.

Since the plurality of shield members 9 are disposed to overlap with each other in a plan view, noise, such as radiation noise and noise terminal voltage, generated from power semiconductor elements 7 and their terminals can be further suppressed from radiating to the outside of the semiconductor device 600.

Seventh Preferred Embodiment

Figure 8:
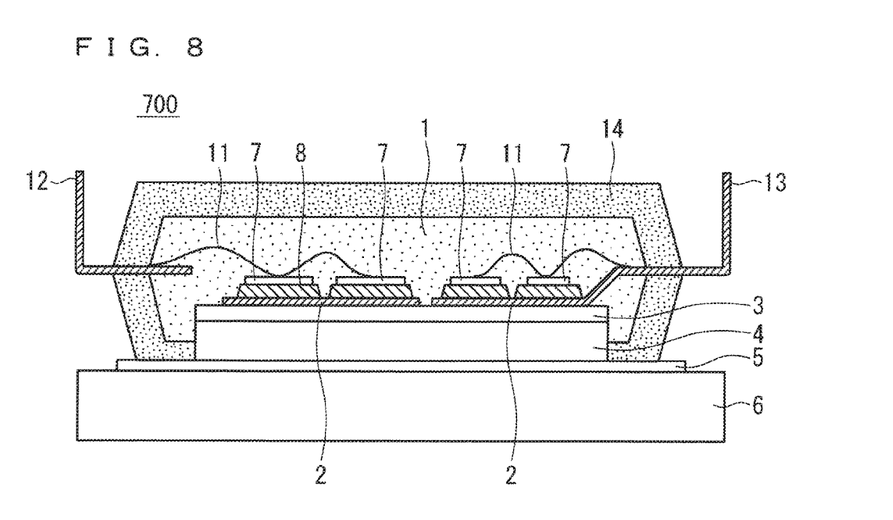
FIG. 8 is a sectional view of a semiconductor device according to a seventh preferred embodiment.

FIG. 8 is a sectional view of a semiconductor device 700 according to a seventh preferred embodiment. In the seventh preferred embodiment, the semiconductor device 700 is obtained by further providing a shield resin 14 to the semiconductor device 50 according to the prior art technique. Since other configurations are the same as those of the prior art technique (FIG. 9), the descriptions thereof are omitted.

Referring to FIG. 8, the shield resin 14 seals a resin 1. Note that the bottom surface of a heat sink 4 and terminals 12, 13 are exposed from the shield resin 14.

The shield resin 14 has a higher magnetic permeability than the resin 1. For example, the shield resin 14 is a resin in which a magnetic material, such as ferrite, in powder form is mixed into an epoxy resin.

<Effect>

The semiconductor device 700 according to the seventh preferred embodiment includes a plurality of semiconductor elements including power semiconductor elements 7, a lead frame 2 including one main surface on which the plurality of semiconductor elements are mounted, the resin 1 that seals the plurality of semiconductor elements and a part of the lead frame 2 where the plurality of semiconductor elements are mounted, and the shield resin 14 that seals the resin 1. The shield resin 14 has a higher magnetic permeability than the resin 1.

In the semiconductor device 700 according to the seventh preferred embodiment, the resin 1 that seals the plurality of semiconductor elements including the power semiconductor elements 7 is sealed by the shield resin 14 having a higher magnetic permeability than the resin 1. With this configuration, radiation noise (electromagnetic wave) generated by a switching operation by the power semiconductor elements 7 can be efficiently shielded, and thus noise, such as radiation noise and noise terminal voltage, generated from the power semiconductor elements 7 and their terminals can be suppressed from radiating to the outside of the semiconductor device 700.

Note that the present invention can freely combine the embodiments and appropriately change or omit the respective embodiments, within the scope of the present invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
a plurality of semiconductor elements including a power semiconductor element;
a lead frame including one main surface on which said plurality of semiconductor elements are mounted;
a resin that seals said plurality of semiconductor elements and a part of said lead frame where said plurality of semiconductor elements are mounted; and
at least one shield member disposed above said plurality of semiconductor elements on a side of said one main surface of said lead frame,
wherein said shield member is held by said resin such that said shield member is spaced from any member electrically connected to at least one of said plurality of semiconductor elements,
said shield member has a higher magnetic permeability or a higher electrical conductivity than said resin,
said shield member includes a first plurality of through holes, which do not overlap said plurality of semiconductor elements in a plan view, and
said shield member includes a second plurality of through holes, each of which is at least partially overlapped with at least one of said plurality of semiconductor elements in said plan view.

2. The semiconductor device according to claim 1, wherein a surface of said shield member includes unevenness.

3. The semiconductor device according to claim 1, wherein said shield member includes any of metal, a magnetic material, or ceramics.

4. The semiconductor device according to claim 1, wherein said first plurality of through holes are aligned with each other in a first row in said plan view, and
said second plurality of through holes are aligned with each other in a second row in said plan view.

5. The semiconductor device according to claim 1, wherein said first plurality of through holes are staggered with respect to said plurality of through holes in said plan view.

6. A semiconductor device comprising:
a plurality of semiconductor elements including a power semiconductor element;
a heat sink;
a lead frame over said heat sink, said lead frame including one main surface on which said plurality of semiconductor elements are mounted;
a resin that seals said plurality of semiconductor elements and a part of said lead frame where said plurality of semiconductor elements are mounted; and
a shield resin that seals said resin,
wherein said shield resin has a higher magnetic permeability than said resin,
a bottom surface of said heat sink is exposed from said shield resin, and
a portion of said shield resin makes direct contact with said heat sink.

7. A semiconductor device comprising:
a plurality of semiconductor elements including a power semiconductor element;
a lead frame including one main surface on which said plurality of semiconductor elements are mounted;
a resin that seals said plurality of semiconductor elements and a part of said lead frame where said plurality of semiconductor elements are mounted; and
at least one shield member disposed above said plurality of semiconductor elements on a side of said one main surface of said lead frame,
wherein said shield member is held by said resin,
said shield member has a higher magnetic permeability or a higher electrical conductivity than said resin,
a surface of said shield member includes unevenness,
said unevenness includes first projections and second projections,
said first projections protrude away from said plurality of semiconductor elements on one side of said shield member, and
said second projections protrude towards said plurality of semiconductor elements on an opposite side of said shield member.

8. A semiconductor device comprising:
a plurality of semiconductor elements including a power semiconductor element;
a lead frame including one main surface on which said plurality of semiconductor elements are mounted;
a resin that seals said plurality of semiconductor elements and a part of said lead frame where said plurality of semiconductor elements are mounted; and
at least one shield member disposed above said plurality of semiconductor elements on a side of said one main surface of said lead frame,
wherein said shield member is held by said resin such that said shield member is spaced from any member electrically connected to at least one of said plurality of semiconductor elements,
said shield member has a higher magnetic permeability or a higher electrical conductivity than said resin, and
said shield member includes a plurality of through holes, all of which do not overlap said plurality of semiconductor elements in a plan view.

9. The semiconductor device according to claim 8, wherein said plurality of through holes, all of which are provided on one side of said plurality of semiconductor elements in said plan view.

* * * * *